US009601691B2

(12) United States Patent
Park

(10) Patent No.: US 9,601,691 B2
(45) Date of Patent: Mar. 21, 2017

(54) SEMICONDUCTOR APPARATUS AND METHOD FOR FABRICATING THE SAME

(71) Applicant: SK hynix Inc., Gyeonggi-do (KR)

(72) Inventor: Hae Chan Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/600,944

(22) Filed: Jan. 20, 2015

(65) Prior Publication Data

US 2015/0372059 A1 Dec. 24, 2015

(30) Foreign Application Priority Data

Jun. 24, 2014 (KR) ......................... 10-2014-0077504

(51) Int. Cl.
*H01L 45/00* (2006.01)
*H01L 27/24* (2006.01)

(52) U.S. Cl.
CPC .......... *H01L 45/1233* (2013.01); *H01L 45/04* (2013.01); *H01L 45/06* (2013.01); *H01L 45/124* (2013.01); *H01L 45/144* (2013.01); *H01L 45/147* (2013.01); *H01L 45/1616* (2013.01); *H01L 27/2463* (2013.01)

(58) Field of Classification Search
CPC ..... H01L 27/2463; H01L 43/12; H01L 45/06; H01L 45/141; H01L 45/1675; H01L 43/08; H01L 45/1233
See application file for complete search history.

(56) References Cited

U.S. PATENT DOCUMENTS

| 2011/0155985 A1* | 6/2011 | Oh ....................... H01L 27/2409 257/2 |
| 2011/0186798 A1* | 8/2011 | Kwon ..................... H01L 45/00 257/2 |
| 2011/0198555 A1* | 8/2011 | Kikuchi .................. H01L 45/06 257/3 |
| 2012/0068136 A1* | 3/2012 | Park ....................... H01L 45/06 257/1 |
| 2012/0267601 A1 | 10/2012 | Lam et al. |
| 2013/0082231 A1* | 4/2013 | Tada .................. G11C 13/0007 257/4 |
| 2013/0140515 A1* | 6/2013 | Kawashima .......... H01L 45/085 257/4 |
| 2015/0109093 A1* | 4/2015 | Higano ................... H01L 45/08 338/20 |
| 2015/0129827 A1* | 5/2015 | Chen ...................... H01L 45/06 257/4 |

FOREIGN PATENT DOCUMENTS

KR 1020110035784 4/2011

* cited by examiner

*Primary Examiner* — Michele Fan
(74) *Attorney, Agent, or Firm* — IP & T Group LLP

(57) ABSTRACT

A semiconductor apparatus includes a variable resistor including a variable resistance layer, which is formed to surround on an inner surface of a resistive region, and an insert layer which is formed in the variable resistance layer and has a resistivity being different from that of the variable resistance layer.

9 Claims, 7 Drawing Sheets

SEMICONDUCTOR APPARATUS AND METHOD FOR FABRICATING THE SAME

CROSS-REFERENCES TO RELATED APPLICATION

This application claims priority under 35 U.S.C. 119(a) to Korean application No. 10-2014-0077504, filed on Jun. 24, 2014, which is incorporated by reference in its entirety.

BACKGROUND

1. Technical Field

Various embodiments of the inventive concept relate to a semiconductor apparatus having variable resistance characteristics, and a method for fabricating the same.

2. Related Art

With the rapid development of mobile and digital information communication and the consumer-electronics industry, studies on existing electronic charge-controlled devices have encountered limitations. Thus, new functional memory devices other than the existing electronic charge-controlled devices need to be developed. In particular, next-generation memory devices with large capacity, ultra-high speed, and ultra-low power consumption need to be developed to satisfy the demand of large capacity memories in main information apparatuses.

Variable resistive memory devices, which use resistive properties as a memory medium, have been suggested as the next-generation of memory devices. Typical examples of variable resistance memory devices are resistive random access memories (ReRAMs), phase-change RAMs (PCRAMs), magneto-resistive RAMs (MRAMs), and spin-transfer torque magnetoresistive RAMs (STTMRAMs).

Each of the variable resistive memory devices may include a switch and a resistor, and store data "0" or "1" according to the state of the resistor.

In particular, the PCRAM may include a phase-change material which is stabilized to either a crystalline state or an amorphous state by heat and has a switching characteristic between the different resistive states. For example, the phase-change material may be a chalcogenide material, such as germanium-antimony-tellurium (Ge—Sb—Te, GST).

A resistance of the conventional resistive element, such as a variable resistance layer, increases over time. Thus, there is high demand for a method for avoiding the resistance of the variable resistance layer increase over time.

SUMMARY

According to an embodiment of the present invention, a semiconductor apparatus may include a variable resistor including a variable resistance layer, which is formed to surround on an inner surface of a resistive region, and an insert layer which is formed in the variable resistance layer and has a resistivity being different from that of the variable resistance layer.

According to an embodiment of the present invention a method for fabricating a semiconductor apparatus may include forming a resistive region, forming a variable resistor in the resistive region. The forming of the variable resistor includes forming a variable resistance material on an inner surface of the resistive region, forming an insert material has a resistivity being different from that of the variable resistance material and is in the variable resistance material and forming a variable resistance layer and an insert layer by etching back the variable resistance material and the insert material to a predetermined height.

These and other features, aspects, and embodiments are described below.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
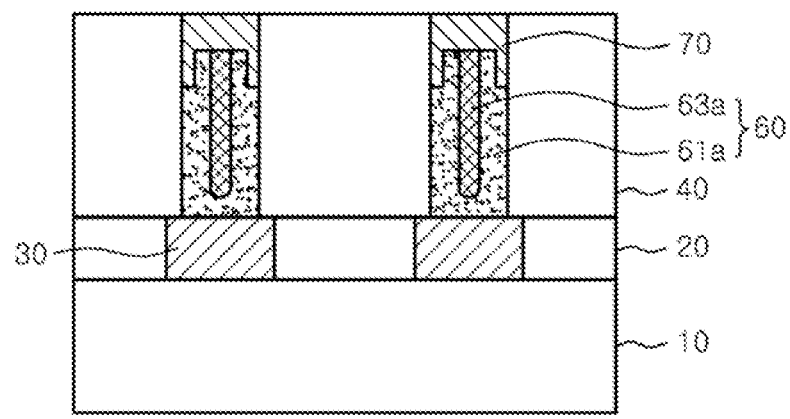
FIG. 1 is a cross-sectional view illustrating a semiconductor apparatus according to an embodiment of the present invention.

Exemplary embodiments will be described in greater detail with reference to the accompanying drawings. Variations in the shapes of the Illustrations as a result of, for example, manufacturing techniques and/or tolerances, are to be expected. Thus, embodiments should not be construed as limited to the particular shapes illustrated, but may include deviations in shapes that result, for example, from manufacturing and even design. In the drawings, lengths, widths, and heights of layers and regions may be exaggerated for clarity. Like reference numerals in the drawings denote like elements. It is also understood that when a layer is referred to as being "on" another layer or substrate, it may be directly on the layer or substrate, or intervening layers may be present. It is also noted that in this specification, "connected/coupled" refers to one component not only directly coupling another component but also indirectly coupling another component through an intermediate component. In addition, a singular form may include a plural form, and vice versa, as long as it is not specifically mentioned.

The present invention is described herein through the use of preferred embodiments. However, the present invention should not be construed as limited to the disclosed embodiments. It should be appreciated by those of ordinary skill in the art that changes may be made to these exemplary embodiments without departing from the principles and spirit of the present invention. Finally, in this document, all "embodiment(s)" refer to embodiments of the present invention or the disclosed inventive concept, unless stated otherwise.

Figure 11:
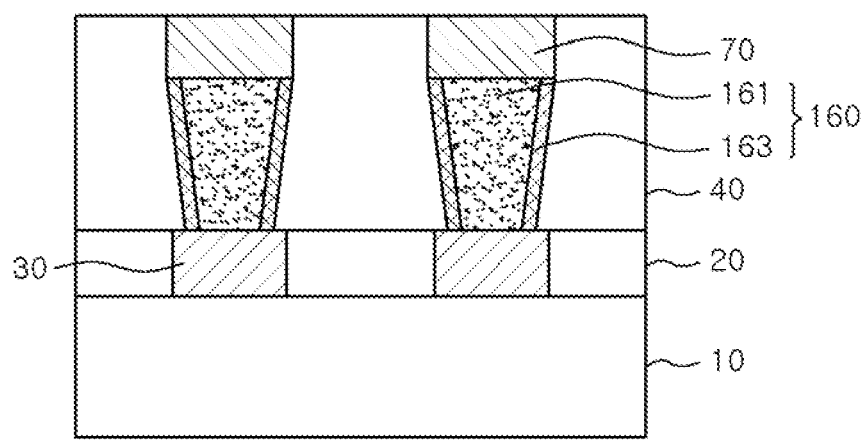
FIG. 11 is a cross-sectional view illustrating a semiconductor apparatus according to another embodiment of the present invention.

Referring to FIGS. 1 and 11, a semiconductor apparatus having resistance variable characteristics may include a lower electrode 30, a variable resistor 60, and an upper electrode 70.

The lower electrode 30 may be formed in a first insulating layer 20, formed on a semiconductor substrate 10, which is a base insulating layer. A switch (not shown) may be formed in the semiconductor substrate 10 and the first insulating layer 20. The lower electrode 30 may include a doped polysilicon layer or a metal material having high resistivity.

The variable resistor 60 may include a variable resistance layer 61a and an insert layer 63a.

The variable resistance layer 61a may be formed of a variable resistance material. The variable resistance material may include various materials, such as, a PCMO ($Pr_{1-x}Ca_xMnO_3$) layer for a ReRAM, a chalcogenide layer for a PCRAM, a magnetic layer for a MRAM, a magnetization reversal device layer for a spin-transfer torque magnetoresistive RAM (STTMRAM), or a polymer layer for a polymer RAM (PoRAM). However, the material for the variable resistance layer is not limited thereto, and may include any material having variable resistance characteristics which are suitable for switching between different resistive states by applying a voltage or current.

For example, the variable resistance material may include a phase-change material. The phase-change material may be a chalcogenide material, such as, GST (Ge—Sb—Te). The variable resistance layer 61a including the phase-change material may be stabilized to either a crystalline state or an amorphous state by heat. This state change is responsible for the difference in resistive states.

The variable resistance layer 61a may be formed in a second insulating layer 40 and on the lower electrode 30. The second insulating layer 40 may include a variable resistor region in which the variable resistor 60 is formed, and the variable resistor region may form of a hole (see 45 of FIG. 2) exposing the lower electrode 30. The variable resistance layer 61a may be formed by a thin film on an inner surface of the variable resistor region in the second insulating layer 40.

The insert layer 63a may be formed in a space surrounded with the variable resistance layer 61a. That is, when the variable resistance layer 61a is formed in a thin film form in the hole 45, a space may be formed in the variable resistance layer 61a, and an insert material may be deposited in the empty space to form the insert layer 63a. The insert layer 63a may be formed to have substantially the same height as the variable resistance layer 61a. A bottom of the insert layer 63a may be located higher than that of the variable resistance layer 61a.

The insert layer 63a may include a catalyst layer. The catalyst layer may include at least one of an aluminum nitride (AlN) layer, a boron nitride (BN) layer, an aluminum oxide (AlO) layer, a tantalum nitride (TaN) layer, a tungsten (W) layer, a tungsten nitride (WN) layer, a cobalt tungsten (CoW) layer, a nickel tungsten (NiW) layer, and an yttrium oxide layer.

The upper electrode 70 may be formed on the variable resistance layer 61a and the insert layer 63a. Specifically, the upper electrode 70 may be formed to cover upper surfaces of the variable resistance layer 61a and the insert layer 63a and to surround a portion of a lateral surface of the variable resistance layer 61a bordering the upper surface of the variable resistance layer 61a.

In the semiconductor apparatus having the above-described structure, the insert layer 63a is formed in the variable resistance layer 61a which is formed by a thin film, and thus the variable resistance layer 61a may be formed without defects such as voids or seams.

A method for fabricating a semiconductor apparatus according to an embodiment of the present invention will be described with reference to FIGS. 2 to 8.

Figure 2:
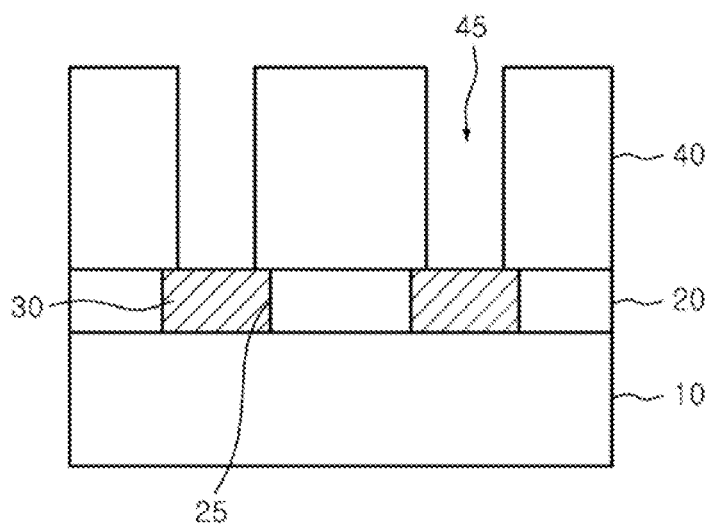
FIG. 2 is a cross-sectional view illustrating a method for fabricating a semiconductor apparatus according to an embodiment of the present invention.

Referring to FIG. 2, a base insulating layer 20 is formed on a semiconductor substrate 10 including a switching layer (not shown), and a contact hole 25 is formed by etching a predetermined portion of the base insulating layer 20. A lower electrode 30 is formed by filling the contact hole 25 with a conductive material. The lower electrode 30 may be electrically coupled to the switching layer.

An interlayer insulating layer 40 is formed on the semiconductor substrate on which the lower electrode 30 is formed. A hole 45 is formed to expose a surface of the lower electrode 30 by etching the Interlayer insulating layer 40.

Figure 3:
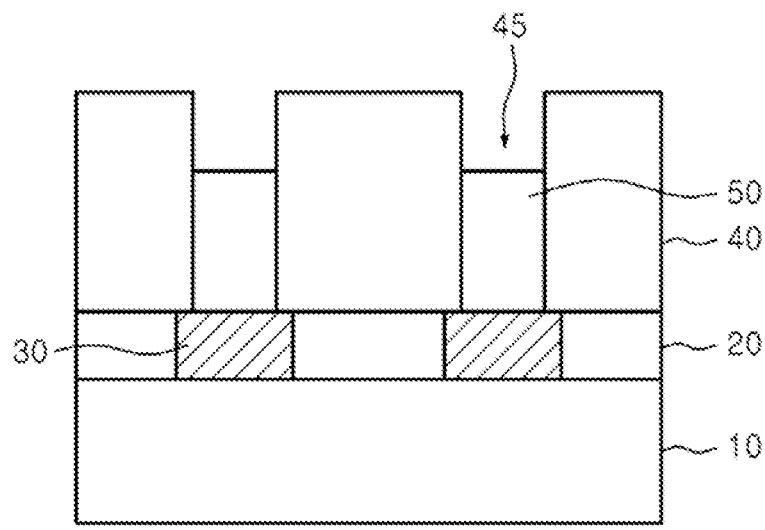
FIG. 3 is a cross-sectional view illustrating a method for fabricating a semiconductor apparatus according to an embodiment of the present invention.

Referring to FIG. 3, an insulating material is deposited on the semiconductor substrate in which the hole 45 is formed, to gap-fill the hole 45. The insulating material is recessed by a predetermined thickness in such a manner that a gap-fill insulating layer 50 having a predetermined height is left in a lower portion of the hole 45. The gap-fill insulating layer 50 may be a spin on dielectric (SOD) layer, but the material for the gap-fill insulating layer 50 is not limited thereto. Through the recess process on the gap-fill insulating layer 50, an upper sidewall of the hole 45 is exposed.

Figure 4:
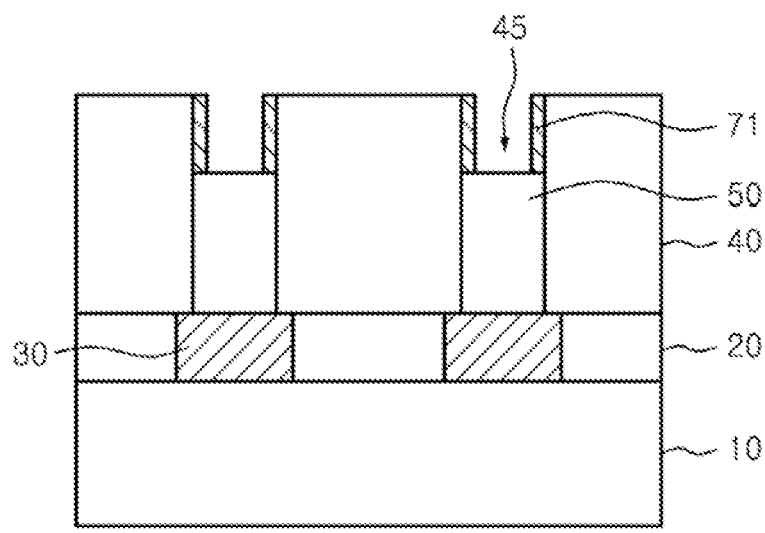
FIG. 4 is a cross-sectional view illustrating a method for fabricating a semiconductor apparatus according to an embodiment of the present invention.

Referring to FIG. 4, a conductive material is deposited on the gap-fill insulating layer 50 then spacer-etched to form a first upper electrode 71 on an upper inner sidewall of the hole 45. The first upper electrode 71 functions to surround a portion of a lateral surface of a variable resistance layer 61a to be described later.

Figure 5:
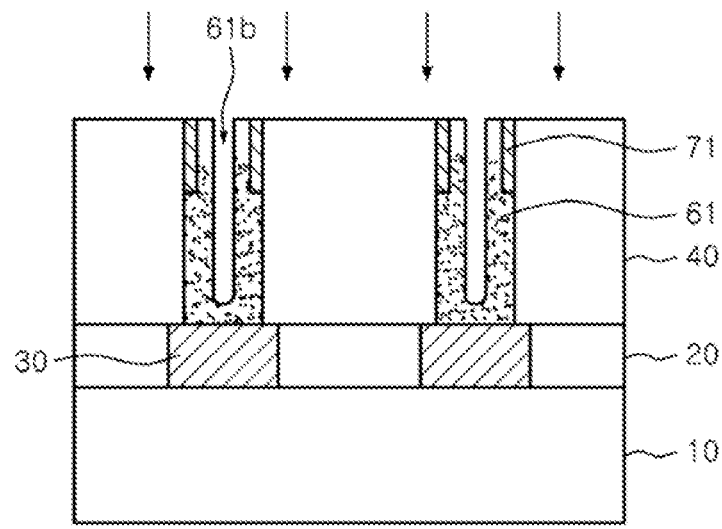
FIG. 5 is a cross-sectional view illustrating a method for fabricating a semiconductor apparatus according to an embodiment of the present invention.

Referring to FIG. 5, the gap-fill insulating layer 50 shown in FIG. 4, is removed and a variable resistance material 61 is deposited in the hole 45 in which the first upper electrode 71 is left. In the process of forming the variable resistance material 61, the variable resistance material 61 may be deposited in a thin film form on an inner surface of the hole 45 through an atomic layer deposition (ALD) method. For example, the variable resistance material 61 may be deposited in a temperature range of 200 to 400° C. The ALD-variable resistance material 61 may have an amorphous phase.

As the variable resistance material 61 is deposited in a thin film form in the hole 45, an empty space 61b may be formed in the variable resistance material 61.

Figure 6:
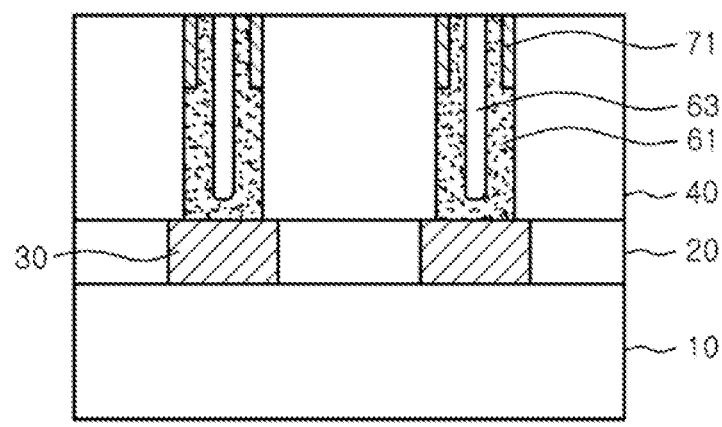
FIG. 6 is a cross-sectional view illustrating a method for fabricating a semiconductor apparatus according to an embodiment of the present invention.

Referring to FIG. 6, an insert material 63 is deposited in the empty space (see 61b of FIG. 5) of the variable resistance material 61. The insert material 63 may be deposited through an ALD method. The insert material 63 may include at least one of an aluminum nitride (AlN) layer, a boron nitride (BN) layer, an aluminum oxide (AlO) layer, a tantalum nitride (TaN) layer, a tungsten (W) layer, a tungsten nitride (WN) layer, a cobalt tungsten (CoW) layer, a nickel tungsten (NiW) layer, and an yttrium oxide layer.

Figure 7:
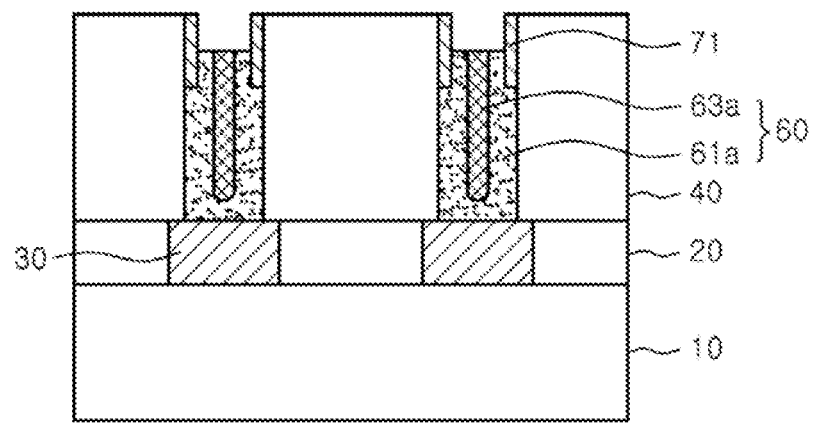
FIG. 7 is a cross-sectional view illustrating a method for fabricating a semiconductor apparatus according to an embodiment of the present invention.

Referring to FIG. 7, the variable resistance material 61 and the insert material 63 are etched back to a predetermined height to form a region for an upper electrode (see 70 of FIG. 8) as well as a variable resistor 60 including the variable resistance layer 61a and an insert layer 63a.

Figure 8:
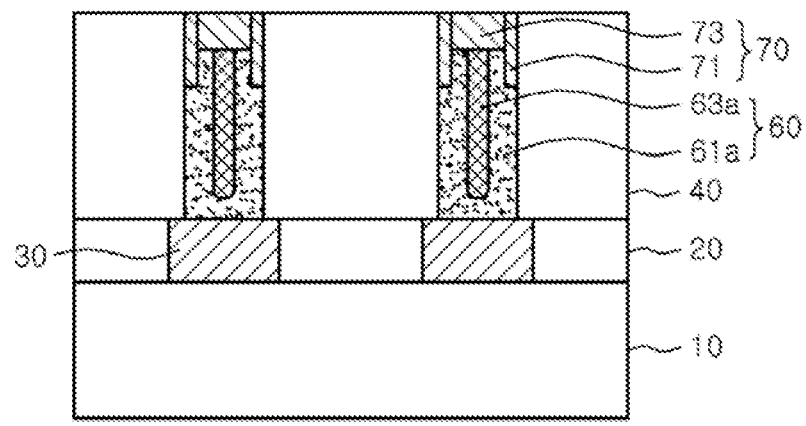
FIG. 8 is a cross-sectional view illustrating a method for fabricating a semiconductor apparatus according to an embodiment of the present invention.

Referring to FIG. 8, after the variable resistor 60 is formed, a second upper electrode 73 is formed through a process of gap-filling a region from which the variable resistance material 61 and the insert material 63 were etched back in FIG. 7, with a conductive material, and planarizing the conductive material. The upper electrode 70 may include a second upper electrode 73 together with a first upper electrode 71, which was previously formed. That is, the upper electrode 70 may include the first electrode 71 surrounding a portion of a lateral surface of the variable resistance layer 61a and bordering an upper surface thereof, and the second upper electrode 73 covering the upper surfaces of the variable resistance layer 61a and the insert layer 63a. As the contact area between the upper electrode 70 and the variable resistor 60 is increased, contact resistance between the upper electrode 70 and the variable resistor 60 may be reduced, thus current efficiency may be improved.

Figure 9:
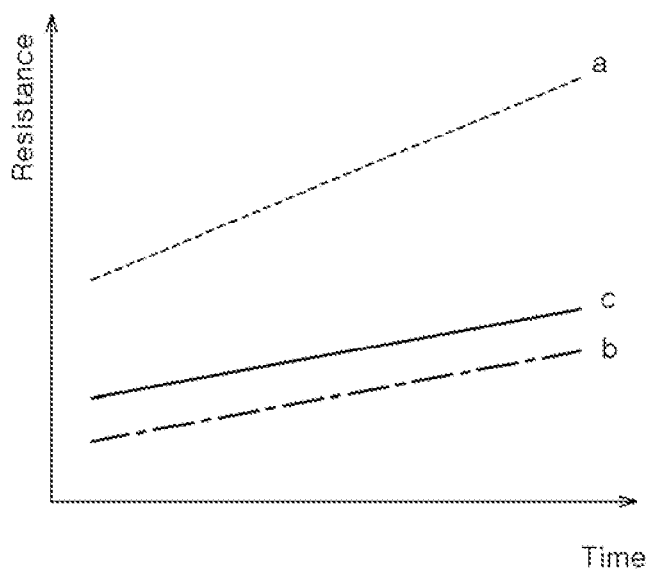
FIG. 9 is a view illustrating resistance drift of different semiconductor apparatuses including an embodiment of the present invention.

Referring to FIG. 9, (a) indicates resistance drift of a conventional variable resistance layer, that is, resistance change over time, (b) indicates resistance drift of a conventional insert layer, and (c) indicates resistance drift of the variable resistor (see 60 of FIG. 1) according to an embodiment of the present invention.

It can be seen that the resistance of the conventional variable resistance layer (a) increases over time, and the resistance of the insert layer (b) changes slightly over time.

In the variable resistor 60 including the variable resistance layer and the insert layer, when the variable resistor includes a fixed resistor such as the insert layer, the resistance of the variable resistor may be represented as the sum of resistances of parallel resistors in a read operation. Therefore, the resistance drift (c) of the semiconductor apparatus in the embodiment of the present invention may be improved compared to a semiconductor apparatus having only a variable resistance layer.

Figure 10:
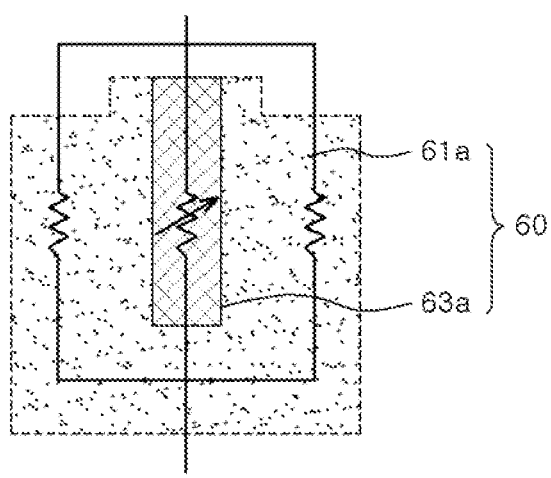
FIG. 10 is an equivalent circuit diagram illustrating a variable resistor of a semiconductor apparatus according to an embodiment of the present invention.
Figure 12:
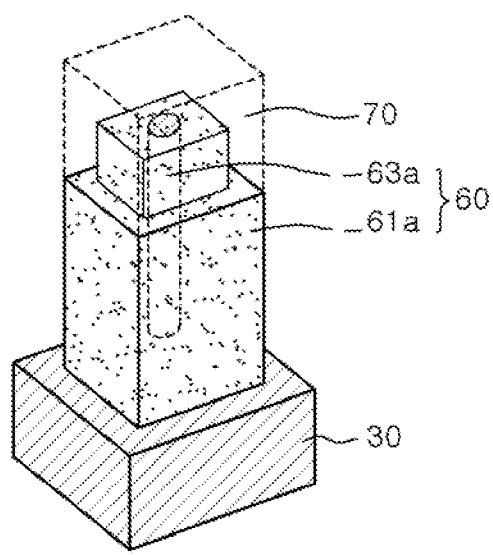
FIG. 12 is a perspective view illustrating a portion of a semiconductor apparatus according to an embodiment of the present invention.
Figure 13:
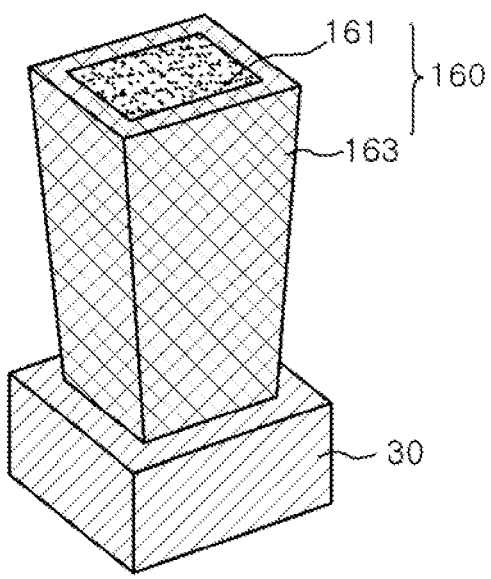
FIG. 13 is a perspective view illustrating a portion of a semiconductor apparatus according to another embodiment of the present invention.

Referring to FIGS. 10 and 12, a semiconductor apparatus may include a lower electrode 30, a variable resistor 160, and an upper electrode 70. The lower electrode 30 and the upper electrode 70 are the same as the lower electrode 30 and the upper electrode 70 illustrated in FIG. 1, and thus a detailed description thereof will be omitted.

The variable resistor 160 may include an insert layer 163 and a variable resistance layer 161. The insert layer 163 in the embodiment may be formed on an inner sidewall of a hole (not shown) formed in a second insulating layer 40 in a thin film form and, specifically, only on the inner sidewall of the hole. The surfactant layer 163 may be formed on the inner sidewall of the hole. The insert layer 163 may be formed through a process of forming a surfactant material in thin film form in the hole, followed by removing a portion of the insert material on the bottom of the hole through an etch back method.

The variable resistance layer 161 may be formed to fill the inside of the hole surrounded with the insert layer 163. That is, the insert layer 163 surrounds a lateral surface of the variable resistance layer 161.

The variable resistor 160 may be heat-treated during the process for fabricating the semiconductor apparatus. In the heat-treatment process, the insert layer 163 may react with the variable resistance layer 161, thus the variable resistance layer 161 may be densely formed without defects.

Since the insert layer 163 has the above-described structure, the variable resistance layer 163 is in direct contact with the lower electrode 30, and thus voltage drop, which could occur through the insert layer 163 interposed between the variable resistance layer 161 and the lower electrode 30, may be avoided.

As described above, in the semiconductor apparatus according to the embodiment of the present invention, as a variable resistor includes a variable resistance layer and an insert layer, the variable resistance layer may be represented as the sum of resistance of parallel resistors in read operation, and the resistance of the variable resistance layer changes slightly over time.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor apparatus comprising:
a variable resistor including a variable resistance layer and an insert layer, wherein a space is formed in the variable resistance layer, wherein the insert layer completely fills the space so that the insert layer is surrounded by the variable resistance layer, wherein the variable resistance layer includes a first lower portion and a first upper portion, wherein the insert layer includes a second lower portion and a second upper portion, wherein the first lower portion of the variable resistance layer surrounds the second lower portion of the insert layer, wherein the first upper portion of the variable resistance layer surrounds the second upper portion of the insert layer; and
an upper electrode including a third upper portion and a third lower portion,
wherein the third upper portion of the upper electrode is formed over the first upper portion of the variable resistance layer and over the second upper portion of the insert layer,
wherein the third lower portion of the upper electrode extends from the third upper portion of the upper electrode downward to surround the first upper portion of the variable resistance layer,
wherein the first upper portion of the variable resistance layer is provided between the second upper portion of the insert layer and the third lower portion of the upper electrode,
wherein the second upper portion of the insert layer is spaced apart from the third lower portion of the upper electrode, and
wherein the insert layer has a resistivity different from that of the variable resistance layer.

2. The semiconductor apparatus of claim 1, further comprising:
a semiconductor substrate positioned to support the variable resistor;
a lower electrode formed on the semiconductor substrate and electrically connected to the variable resistance layer; and an interlayer insulating layer formed on the semiconductor substrate, the interlayer insulating layer including the resistive region that exposes the lower electrode.

3. The semiconductor apparatus of claim 1, wherein the variable resistance layer is formed outside the insert layer.

4. The semiconductor apparatus of claim 1, wherein the variable resistance layer includes any one of a PCMO layer, a chalcogenide layer, a magnetic layer, a magnetization reversal device layer, and a polymer layer.

5. The semiconductor apparatus of claim 1, wherein the insert layer includes a catalyst layer.

6. The semiconductor apparatus of claim 5, wherein the insert layer includes at least one of an aluminum nitride layer, a boron nitride layer, an aluminum oxide layer, a tantalum nitride layer, a tungsten layer, a tungsten nitride layer, a cobalt tungsten layer, a nickel tungsten layer and an yttrium oxide layer.

7. The semiconductor apparatus of claim 1,
wherein a side surface of the third lower portion of the upper electrode vertically aligns with a side surface of the first lower portion of the variable resistance layer.

8. A semiconductor apparatus comprising:
a variable resistance layer, wherein a bottom of the variable resistance layer is located at a first level;
an upper electrode including an upper portion and a lower portion, wherein the upper portion of the upper electrode is provided over the top of the variable resistance layer, wherein the lower portion of the upper electrode extends from the upper portion of the upper electrode downward to surround the variable resistance layer;
a space provided in the variable resistance layer and capped by the upper portion of the upper electrode; and
an insert layer completely filling the space and surrounded by the variable resistance layer, wherein a top of the insert layer is located at a second level,
wherein the variable resistance layer extends between the insert layer and the lower portion of the upper electrode,
wherein the insert layer is spaced apart from the lower portion of the upper electrode,
wherein a bottom of the lower portion of the upper electrode is located at a third level,
wherein the third level is higher than the first level and lower than the second level, and
wherein the insert layer has a resistivity different from that of the variable resistance layer.

9. The semiconductor apparatus of claim 8,
wherein a top of the variable resistance layer is located at a higher level than the third level.

* * * * *